United States Patent [19]
Karabatsos

[11] Patent Number: 5,953,215
[45] Date of Patent: Sep. 14, 1999

[54] APPARATUS AND METHOD FOR IMPROVING COMPUTER MEMORY SPEED AND CAPACITY

[76] Inventor: Chris Karabatsos, 42 Jumping Brook Ln., Kingston, N.Y. 12401

[21] Appl. No.: 09/105,892

[22] Filed: Jun. 26, 1998

Related U.S. Application Data

[60] Provisional application No. 60/067,210, Dec. 1, 1997.
[51] Int. Cl.[6] .................................................. H05K 1/14
[52] U.S. Cl. ......................... 361/767; 361/765; 361/760; 361/736; 361/784; 361/803; 365/63; 365/51; 365/227; 711/100; 711/101; 711/103; 711/104; 711/105
[58] Field of Search ..................................... 361/767, 765, 361/736, 784, 779, 803, 760; 365/63, 51, 227; 711/100, 101, 103, 104, 105

[56] References Cited

U.S. PATENT DOCUMENTS

| | | | |
|---|---|---|---|
| 5,272,664 | 12/1993 | Alexander et al. | 365/52 |
| 5,426,759 | 6/1995 | Padgaonkar | 395/425 |
| 5,530,623 | 6/1996 | Sanwo et al. | 361/788 |
| 5,654,566 | 8/1997 | Johnson | 257/295 |
| 5,666,322 | 9/1997 | Conkle | 365/233 |
| 5,708,597 | 1/1998 | Kelem | 365/230.03 |
| 5,790,447 | 8/1998 | Ladson et al. | 365/52 |

Primary Examiner—Leo P. Picard
Assistant Examiner—David Foster
Attorney, Agent, or Firm—Mark P. White

[57] ABSTRACT

A method and apparatus for enhancing memory speed and capacity utilizes a set of electronic switches to isolate the computer data bus from the memory chips. The apparatus includes one or more multi-sided memory boards with etched leads, lands and feed-through. The memory chips may be mounted on either one side, or both sides of each board. Connection between the memory board and the mother board are made by means of a comb of contact fingers, or edge-connector which mates with a connector on the mother board. The data lines and address lines of the computer bus are distinct from each other, and routed to the memory board via the edge connector. A set of CMOS TTL or FET switches are located adjacent to the comb, and are switched on and off by a decoded combination of address, control, or data lines or by a distinct enable line provided by the CPU, controller or other decoding means located on the motherboard. As a result, only the memory chips actually required for the memory access are switched on, so that the other memory chips are isolated from the data bus. Because of this isolation, the capacitance of the non-switched components is not seen by the data bus, resulting in a lower overall capacitance, and a higher inherent memory access.

22 Claims, 2 Drawing Sheets

APPARATUS AND METHOD FOR IMPROVING COMPUTER MEMORY SPEED AND CAPACITY

PROSECUTION HISTORY

This is a continuation of a provisional application filed on Dec. 1, 1997, application Ser. No. 60/067,210.

FIELD OF THE INVENTION

The present invention relates to computer systems with enhanced memory access speed, or, conversely, enhanced memory capacity, and more specifically, to systems which so provide by electronically reducing the capacitance between the memory bus and the memory modules.

DESCRIPTION RELATIVE TO THE PRIOR ART

Increasing computer performance and capacity has resulted in a constant demand for larger amounts of RAM (random-access memory), and faster RAM memory.

Factors which limit the amount and speed of RAM include the configuration of the memory chips which contain the RAM, and the interconnections on the printed circuit boards which carry the chips.

As it pertains to the memory packaging used today in the industry to assemble memory, and in order to meet a desired DATA BUS width which is standard in the industry, a cluster of memory chips are assembled together on a printed circuit board. These boards are of several types, known as SIMMs, DIMMs, SODIMMs, RIMMS,etc. However, for the sake of brevity, the term DIMM will be used hereinafter to refer to any or all of these different types.

The DIMMs have conductive pads at the edge of the boards, called edge connectors, which make the electronic connection required when inserting into connectors, which also act to support the DIMMs and the memory chips which are assembled on DIMM boards.

The connectors are generally soldered onto a motherboard to facilitate channeling the conductive lines from the computer processor (CPU), or from the controller chip to the DIMM memory chips, or DRAMs (or other type of memory chip as previously described). There are DATA LINES, ADDRESS LINES, AND CONTROL LINES, which together form the computer BUS SYSTEM.

The DATA LINES are bi-directional. They connect bi-directional points of the CPU or controller with the bi-directional points of the DRAM chips that are on the DIMMs. Any physical printed wire length between two points will be driven by an electronic component, the driver (D), and be received by another electronic component, the receiver (R). The speed by which the physical printed wire is charged up depends on several factors one of which is the ability of the electronic component that drives or activates this line to provide such required charge, and the other is the total capacitance of the line been charged and other parameters. The amount of charge accumulated on the line is determined by the Capacitance of the line. By the laws of physics, each printed wire forms a capacitor whose capacitance is the capacitance of the printed wire line length and the capacitance of all the electronic component pins and circuits connected to the line.

When connectors for D are clustered on the BUS to make up the desired memory density for the specified system, the cumulative capacitance on each DATA LINE is increased. In order to attain desired speed performance, it is specified for the system to have a limited number of DIMMs attached to the BUS before the DATA LINES are required to be re-powered, or redriven.

The present construction of the DIMMs is such that a number of DRAMS are connected together in order to increase the memory density. Each DRAM chip pin presents a specified capacitive load. The printed wire line that is used to connect all the DRAM chips together adds to the capacitive load. The total allowable capacitive load that is measured at the entry TAB of the DATA LINE at the DIMM is specified by the system board designer and becomes the limiting factor of how many DIMMs can be used on the BUS to make up the desired density.

During operation, only one DIMM is selected at a time. However the selected DIMM data lines see the entire capacitive load that is present on the entire bus by all other DIMMs, the connectors, and the motherboard printed wire length, plus all other factors.

The individual leads are not perfect conductors, however, especially at the high speeds at which modern computers run. The memory access speeds are today measured in nanoseconds ($10^{-9}$ seconds), with picosecond ($10^{-12}$ seconds) speeds on the horizon for personal computers.

At such speeds, resistance of the leads, and the capacitance between leads forms a resistance-capacitance circuit which causes the pulses traveling between the connectors and the memory chips to become degraded, sometimes to the point of becoming unreliable.

It is well known that a resistance in series with a capacitance will effect a time delay which is described by $$\Delta t = 1/(RC)$$

where $\Delta t$ = the time delay caused by the RC circuit
R = the resistance
C = the capacitance The result of such an RC delay is to cause a series of sharply defined pulses to become undetectable at some point. Consider, as an example, the idealized pulses shown in FIG. 2a. These have perfectly sharp corners 52, 54, and are easy to detect, but such a waveform is rarely seen at high speeds. Rather, the capacitance which is always present may cause each pulse to exhibit a rise time 56, and a fall time 58. As seen in FIG. 2c, when the rise time 60, and fall time 62, become excessive compared to the pulse width 64, the pulses become highly distorted, and difficult to detect, resulting in detection errors which may become unacceptable.

Thus, the speed at which the memory can be accessed is a direct function of the capacitance an resistance of the leads, as well as other factors. The capacitance is especially troubling, because the capacitance of each line adds to the capacitance of the others. This addition of the capacitances also limits the number of memory chips which can be used to populate a memory board, since the more memory chips, the more leads, and the more leads, the more capacitance is introduced.

To date, no provisions have been made by the industry to use any means to isolate a selected memory module from non-selected memory modules in order to reduce capacitive load and increase speed. No prior art has been found which has utilized FET switching to accomplish such isolation.

The current invention solves this problem by isolating the data leads from the edge connector by means of high-speed FET switches, located close to the connector, which effectively negates the additive effect of line capacitances, as will be described infra.

SUMMARY OF THE INVENTION

It is the general object of this invention to provide an high-speed RAM memory for use in computer systems without sacrificing capacity. It is a further general object of this invention to alternatively provide a high-capacity memory without sacrificing speed. It is a specific object of this invention to provide such high speed, or high capacity memory by means of electronically reducing the capacitance seen by the data lines of the memory.

According to one aspect of the invention, an electronic apparatus includes one or more printed circuit boards of insulating substrate having a network of conductive leads and containing stations applied, pads for attaching electronic components, a comb of connecting terminals integral with the board, the comb configured to engage a connecting port on a mating structure, and a multiplicity of electronic components mounted on the board. Also provided is a plurality of switching devices having an on state and an off state. Each switching device has both a low resistance in the on state and a high resistance in the off state. These switches are mounted to the board in proximity to the comb. In addition, a plurality of leads are connected to between the comb and the switching devices; and between the switching devices and the electronic components. Finally there are means to turn selected switches on and off. When the connections between the comb are switched to the selected components only, the non-selected components being isolated from the comb.

According to another aspect of the invention, the board further includes two separate mounting surfaces, and also contains feed-throughs interconnecting the components on both sides of the boards with the switching means, with the electronic components mounted on both surfaces.

According to another aspect of the invention, addressing means are used to turn the selected switches on and off.

According to still another aspect of the invention, the comb conveys signals including data signals and address signals, where the data signals are distinct from the addressing signals, and where the address signals provide the addressing means.

According to still another aspect of the boards are substantially quadrangular.

According to yet another aspect of the invention the comb is configured to mate with a supporting structure.

According to a further aspect of the electronic components include memory elements.

According to yet a further aspect of the invention the comb is located along an edge of the board.

According to a yet further aspect of the invention a CMOS TTL switch is used as the switch element.

According to a final aspect of the invention a field effect transistor (FET) is used as the switch.

BRIEF DESCRIPTION OF THE DRAWINGS

These, and further features of the invention, may be better understood with reference to the accompanying specification and drawings depicting the preferred embodiment, in which.

DETAILED DESCRIPTION OF THE PREFERRED EMBODIMENTS

Figure 1:
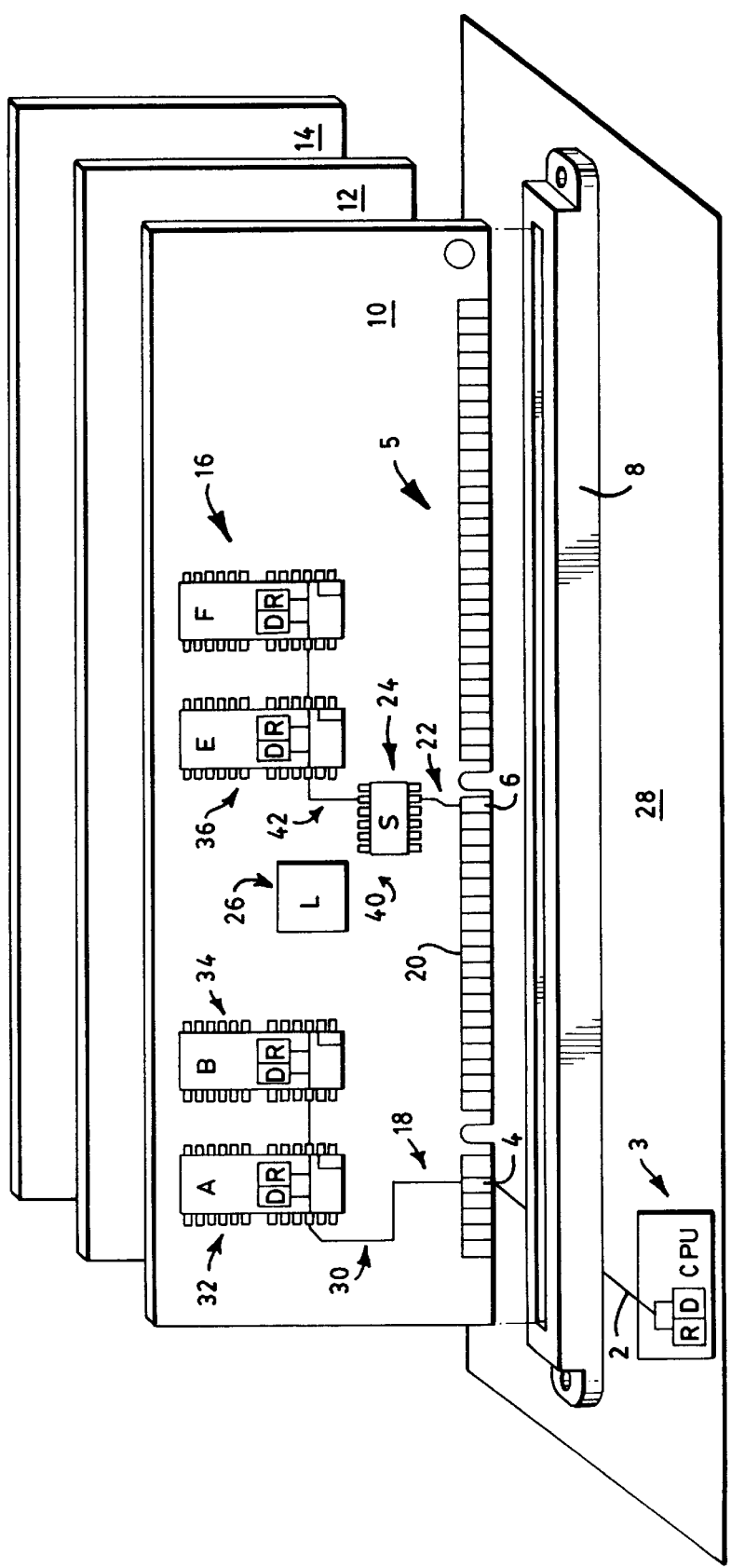
FIG. 1 depicts a perspective view of the invention, showing the electronic components on a multi-board memory configuration.
Figure 2A:
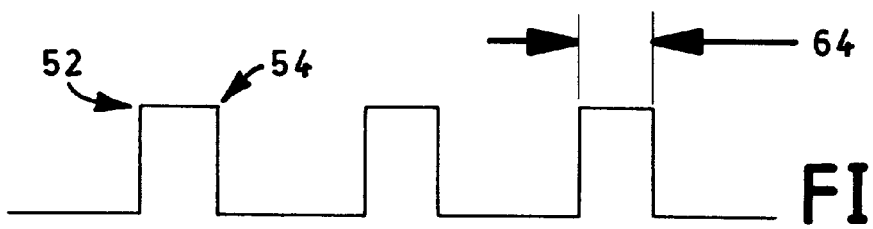
FIG. 2a depicts a memory-timing diagram with no delay.
Figure 2B:
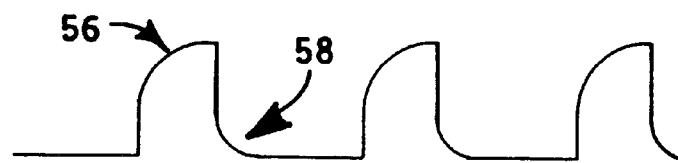
FIG. 2b depicts a memory-timing diagram with a slight delay
Figure 2C:
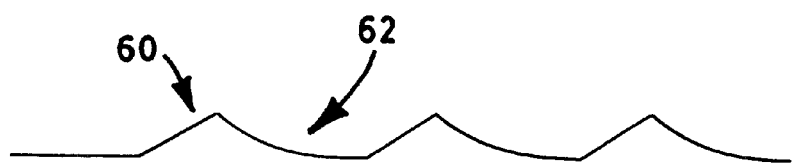
FIG. 2c depicts a memory-timing diagram with a large delay

Referring now to FIG. 1, the memory assembly consists of three boards, or substrates 10, 12, 14. Substrate 10 contains an edge connector 5 which, in turn, contains a number of fingers which mate with connector 12, which is, in turn, mounted on motherboard 28. The boards are substantially quadrangular, in accordance with current standards for such boards. It will be seen that the edge connector is a comb-like array of individual conducting fingers. It should be noted that although three boards are included in this embodiment, there is no inherent limitation to the number of boards which may be included in the current invention.

The boards shown may be multi-layer boards, which are, in effect, a number of connection layers bonded together. Interconnection between the different layers, and between the three substrates shown is by means of feed-throughs, plated-through holes which extend the width of each substrate, and which may connect with conductive material on each layer. The chips shown mounted on the substrates are electrically connected through conductive mounting pads, which provide an extended conductive area to allow good contact between the pins of the computer chips and the leads on the substrates.

Although not shown in FIG. 1, it is often desirable, in order to present the greatest density of computer chips possible, to mount these chips on both mounting surfaces of each substrate. It is clear that, regardless of how many layers of conductive material are used in each substrate, only two mounting surfaces are available.

Shown mounted on the motherboard 28 is a CPU 3, which is not part of this invention. The signals conveyed to the memory board might be generated by a controller chip rather than the CPU. In either case, the signals are connected to the memory board by means of a bus. At present, the computer bus consists of a multiplicity of data lines, a multiplicity of separate address lines, and a multiplicity of control lines. When these lines are etched onto a printed circuit board, such as the motherboard or the memory board, they are called leads. In FIG. 1, a single lead only 2 is shown running from the CPU to the connector 5 via finger 4. The single lead is shown for the sake of clarity, although in reality there are a multiplicity of such leads. when the edge connector 5 is inserted into the connector 8, there will be electrical conductivity from finger 4 onto the memory board 10 via lead 30.

Still referring to FIG. 1, a FET ( field-effect transistor) switch 24 is mounted on the memory board 10 and inserted in series with each DATA LINE. It should be noted that other types of switches are applicable to this application, including, inter alia, CMOS (Complementary Metal Oxide Semiconductor), and TTL (Transistor-Transistor Logic) switches. Whatever technology is used, the switch should have a high impedance in the OFF, or disabled state, a low impedance and negligible propagation delay in the ON, or enabled state, and low capacitance in both states. The switch must be bidirectional in the ON state with negligible propagation delay in both directions, and negligible transmission of the input signal in the OFF state.

A single data lead 22 is shown for the sake of clarity, although in reality there are a multiplicity of such leads. The switch is placed as close to the edge connector 5 as possible in order to minimize the distance of the lead 22 from the finger 6 to the pin of the FET switch 24.

Also shown in FIG. 1 are a number of DRAM chips A, B, E, and F. The other corresponding pin of the switch is wired to the DRAM pins corresponding to the DATA LINE associated with DRAM chips E and F by means of lead 42, which is electrically connected with lead 22 when the switch is closed, or in it ON state. The state of the switch is controlled by the logic decoder 26, which enables switch 24 via line 40. Again, there are a multiplicity of switches, driving the data leads of the memory chips via a multiplicity of leads; a unique enable line to the switch could be provided from the CPU or controller—however, a single lead 42 is shown for the sake of clarity.

When the switch is open, or in the OFF state, there will be a very high-impedance connection between the finger 6 and the lead 42. In effect, finger 6 appears to be the equivalent of an open circuit. The amount of capacitive load presented to the DATA LINE of the BUS by the switch is less than 10 pF (picofarads). The capacitive load presented by the DRAM chips and wires on the side of the FET switch facing the DRAMs is totally isolated from the data bus lines.

When the switch is enabled, on the other hand, the DATA LINE sees the additional capacitive load from the internal connection of the switch 24 to the lead 42, and its connections to the chips 36 and 16. If this internal load is 25 pF, then the total load on the DATA LINE contributed by the selected memory chip is 30 pF, which includes an additional 5 pF of stray capacitance.

Consider now, as an example, a typical memory system, containing 16 DIMMs, which has been tested using the current invention. If no DIMM is selected, the total capacitance seen by each data line is 10 pF per DIMM, or a total of 160 pF.

Assume next that a particular memory access selects only a single one of these 16 DIMMS. Then the capacitive load presented by the 15 DIMMs not selected will be 10 pF per DIMM, or 150 pF. In addition, the single selected DIMM will contribute 30 pF. Thus, the total capacitance presented to the bus will be 150 pF plus 30 pF, or 180 pF.

Assuming that that the capacitance causes a delay of lone nanosecond (ns) for each 50 pF, the delay resulting from this capacitance will be 3.6 ns.

In comparison, consider the system without the switch. The 16 DIMMs will present a capacitance of 16 times 30, or 480 pF. The resulting delay of 9.6 ns is about three times as great, demonstrating the great improvement of the current invention.

Using a figure of 50 pF per lead rather that 25 pF per lead, as is common in the industry today, the figures are even more dramatic. Representing the stray capacitance by the characters CL, the calculations show a capacitance of about 205 pF+CL with the use of the current invention, and about 800 pF+CL using the standard method—a improvement of almost five to one. Experimental data using the current invention confirms these figures.

In an alternative embodiment, the signal (control signal) which controls the FET switch is generated externally to the memory board, and conveyed to the memory board via the edge connector. This control signal may be generated on a motherboard to which the memory modules are mounted by a controller chip specifically included for this purpose. An alternate embodiment includes generation of this control signal on a central processing unit (CPU) or controller located on the motherboard.

In another alternative embodiment, the memory is an integral part of the motherboard. As a result no separate memory boards or connectors therefor are involved in the invention; instead, the FET switch is mounted on the motherboard itself between the memory chips and the bus, and performs the same function in isolating the bus from the memory chips as in the first preferred embodiment.

In still another embodiment, the FET switches, or their equivalents, are included within the memory chips themselves, which may be located on memory boards, or directly on the motherboard itself. These FET switches are controlled in turn from the bus, which is connected to the memory modules.

In all of the alternative embodiments, the switches may be CMOS or TTL switches, in addition to the FET switches previously described.

It will be apparent that improvements and modifications may be made within the purview of the invention without departing from the scope of the invention defined in the appended claims.

I claim:

1. A method for enhancing the performance of an electronic system which comprises a multiplicity of printed circuit boards, a motherboard containing a bus electrically connected to a plurality of connectors, each board further comprising a multiplicity of electronic components and a comb of connecting terminals mating with one of the connectors, the terminals presenting a capacitance to the bus which includes the capacitance of the electronic component connected to the terminals, the method comprising:

a) configuring the system so that only a single board need be accessed at any one time;

b) mounting onto each such board a switch having an on state and an off state, and having an input and output, in which the input is connected to the output via a low resistance in the on state and a high resistance in the off state, and mounted to the board in proximity to the comb;

c) conductively connecting a plurality of leads between the combs and the switch for each such board;

d) conductively connecting a plurality of leads between the switch and the electronic components for each such board;

e) providing selection means to turn the switches for each board on or off; and f) simultaneously switching on the single board requiring access, while maintaining the other boards off, so that only the single board is connected to the bus at any time, the capacitance presented to the bus by each of the non-connected boards is substantially less than the capacitance presented to the bus by the connected board, and the resulting capacitance presented to the bus by the boards is substantially reduced thereby.

2. The method of claim 1, wherein the switch is selected from the group which consists of field-effect transistor switches, complementary metal oxide semiconductor switches, and transistor-transistor logic switches.

3. The method of claim 2, wherein the electronic components comprise memory modules.

4. An electronic device which comprises:

a) a multiplicity of printed circuit boards, each board further comprising a multiplicity of electronic components having a capacitance, and a comb of connecting terminals;

b) a motherboard;

c) a bus contained on the motherboard;

d) a multiplicity of connectors electrically connected to the bus, into each of which the comb of a corresponding board is matingly inserted and electrically connected, the terminals presenting a capacitance to the bus including the capacitance of the components;

e) a switch mounted onto each such board in proximity to the comb, having an on state and an off state, and having an input and output, in which the input is connected to the output via a low resistance in the on state and a high resistance in the off state;

f) a plurality of leads conductively connecting the combs and the input of the switch for each such board;

g) a plurality of leads conductively connecting the output of the switch and the electronic components; and h) selection means to simultaneously turn the switch of a single selected board on, while maintaining the non-selected boards off, so that only a single board is connected to the bus at any time, the capacitance presented to the bus by each of the non-connected boards is substantially less than the capacitance presented to the bus by the connected board, and the resulting capacitance presented to the bus by the boards is substantially reduced as a result.

5. The apparatus of claim 4, wherein each board further comprises two separate mounting surfaces, further comprising feed-throughs interconnecting the components on both sides of the boards with said switching means, and wherein the electronic components are mounted on both said surfaces.

6. The apparatus of claim 5, wherein the means to turn selected switches on and off further comprise addressing means.

7. The apparatus of claim 6, wherein the comb conveys signals comprising data signals and address signals, wherein the data signals are distinct from the addressing signals, and wherein said address signals comprise said addressing means.

8. The apparatus of claim 7, wherein the boards are substantially quadrangular.

9. The apparatus of claim 8, wherein each comb is configured to mate with a corresponding supporting structure.

10. The apparatus of claim 9, wherein the electronic components comprise memory elements.

11. The apparatus of claim 10, wherein each comb is located along an edge of the board.

12. The apparatus of claim 11, wherein the switch is selected from the group which consists of field-effect transistor switches, complementary metal oxide semiconductor switches, and transistor-transistor logic switches.

13. An electronic apparatus comprising:

one or more printed circuit boards;

a multiplicity of electronic components mounted on each board, each electronic component having a capacitance;

a bus;

a switch located on each board, the switch having an on state and an off state, each switch having a low resistance in the on state and a high resistance in the off state;

a plurality of leads conductively connected to between the bus and the switches;

a plurality of leads conductively connected between the switches and the electronic components; and means to simultaneously turn the selected switch on while maintaining the non-selected switches off, so that only a single board is connected to the bus at any time, the capacitance presented to the bus by each of the non-connected boards is substantially less than the capacitance presented to the bus by the connected board, and the resulting capacitance presented to the bus by the boards is substantially reduced as a result.

14. The apparatus of claim 13, wherein the boards further comprise memory boards, and wherein the means to turn the selected switches on and off are located on the memory boards.

15. The apparatus of claim 14, wherein the memory boards are mounted to a motherboard containing the bus, and wherein the means to turn the selected switches on and off are located on the motherboard.

16. The apparatus of claim 15, wherein the motherboard further comprises a central processing unit, and wherein the means to turn the selected switches on and off are generated by the central processing unit.

17. The apparatus of claim 15, wherein the motherboard further comprises a controller chip, and wherein the means to turn the selected switches on and off are generated by the controller chip.

18. The apparatus of claims 13, 14, 15, 16, or 17, wherein the switch is selected from the group which consists of field-effect transistor switches, complementary metal oxide semiconductor switches, and transistor-transistor logic switches.

19. The apparatus of claim 13, wherein the boards further comprise memory boards;

the memory boards further comprise memory chips, and wherein the means to turn the selected switches on and off are located on the memory chips.

20. The apparatus of claims 19, wherein the switch is selected from the group which consists of field-effect transistor switches, complementary metal oxide semiconductor switches, and transistor-transistor logic switches.

21. An electronic apparatus comprising:

a motherboard, with a bus mounted thereto;

a multiplicity of memory elements mounted on the motherboard, each memory element having a capacitance;

a switch corresponding to each memory element, each switch having an on state and an off state, each switch having a low resistance in the on state and a high resistance in the off state;

a plurality of leads conductively connected to between the bus and the switches;

a plurality of leads conductively connected between the switches and the memory elements; and means to simultaneously turn a selected switch on while maintaining the non-selected switches of, so that only a single memory element is connected to the bus at any time, the capacitance presented to the bus by each of the non-connected memory elements is substantially less than the capacitance presented to the bus by the connected memory element, and the resulting capacitance presented to the bus by the boards is substantially reduced thereby.

22. The apparatus of claim 21, wherein the switch is selected from the group which consists of field-effect transistor switches, complementary metal oxide semiconductor switches, and transistor-transistor logic switches.

* * * * *